(12) United States Patent
Lee et al.

(10) Patent No.: US 11,029,722 B2
(45) Date of Patent: Jun. 8, 2021

(54) NOTEBOOK COMPUTER AND KEYBOARD DECORATIVE PANEL THEREOF

(71) Applicant: GETAC TECHNOLOGY CORPORATION, Hsinchu County (TW)

(72) Inventors: Kun-Cheng Lee, Taipei (TW); Juei-Chi Chang, Taipei (TW)

(73) Assignee: GETAC TECHNOLOGY CORPORATION, Hsinchu County (TW)

(*) Notice: Subject to any disclaimer, the term of this patent is extended or adjusted under 35 U.S.C. 154(b) by 0 days.

(21) Appl. No.: 16/900,848

(22) Filed: Jun. 12, 2020

(65) Prior Publication Data

US 2021/0055759 A1 Feb. 25, 2021

Related U.S. Application Data

(60) Provisional application No. 62/889,266, filed on Aug. 20, 2019.

(51) Int. Cl.
| | |
|---|---|
| *G06F 1/16* | (2006.01) |
| *H05K 5/02* | (2006.01) |
| *H05K 5/03* | (2006.01) |
| *H02G 11/00* | (2006.01) |
| *H02G 15/10* | (2006.01) |
| *H02G 15/18* | (2006.01) |
| *H05K 7/02* | (2006.01) |
| *H05K 7/14* | (2006.01) |
| *G06F 1/18* | (2006.01) |

(52) U.S. Cl.
CPC .......... *G06F 1/1616* (2013.01); *G06F 1/1656* (2013.01); *G06F 1/183* (2013.01); *H02G 11/00* (2013.01); *H02G 15/10* (2013.01); *H02G 15/18* (2013.01); *H05K 5/023* (2013.01); *H05K 5/03* (2013.01); *H05K 7/02* (2013.01); *H05K 7/1417* (2013.01)

(58) Field of Classification Search
CPC ...... G06F 1/1616; G06F 1/1656; G06F 1/183; H02G 11/00; H02G 15/10; H02G 15/18; H05K 7/02; H05K 7/1417; H05K 5/023; H05K 5/03
See application file for complete search history.

(56) References Cited

U.S. PATENT DOCUMENTS 5,847,925 A * 12/1998 Progl .................... G06F 1/203
  361/679.47
5,995,373 A * 11/1999 Nagai .................. G06F 1/1616
  16/223

(Continued)

*Primary Examiner* — Abhishek M Rathod

(57) ABSTRACT

A notebook computer and a keyboard decorative panel thereof are provided. The notebook computer includes a casing, a keyboard module and a keyboard decorative panel. The keyboard module is disposed on the casing. The keyboard decorative panel is disposed on the casing to conceal a hinge on the casing and a fastening hole of the keyboard module. The keyboard decorative panel includes a first cover, a second cover, and a flexible member connected between the first cover and the second cover. The flexible member has flexibility. The first cover bends relative to the second cover because of the flexible member. Therefore, the notebook computer and the keyboard decorative panel thereof enhance the ease of changing the keyboard module.

13 Claims, 13 Drawing Sheets

(56) References Cited

U.S. PATENT DOCUMENTS

| | | | | |
|---|---|---|---|---|
| 6,125,029 | A * | 9/2000 | Sasaki | G06F 1/165 |
| | | | | 345/905 |
| 6,272,006 | B1 * | 8/2001 | Lee | G06F 1/1616 |
| | | | | 16/342 |
| 8,477,482 | B2 * | 7/2013 | Lin | G06F 1/169 |
| | | | | 361/679.01 |
| 10,579,112 | B2 * | 3/2020 | North | E05D 3/122 |
| 2001/0001591 | A1 * | 5/2001 | Nakajima | G06F 1/1683 |
| | | | | 361/679.27 |
| 2002/0051339 | A1 * | 5/2002 | Ohashi | G06F 1/203 |
| | | | | 361/679.46 |
| 2004/0114324 | A1 * | 6/2004 | Kusaka | G06F 1/203 |
| | | | | 361/679.53 |
| 2006/0171106 | A1 * | 8/2006 | Cho | G06F 1/1616 |
| | | | | 361/679.27 |
| 2007/0047183 | A1 * | 3/2007 | Goto | G06F 1/1635 |
| | | | | 361/679.26 |
| 2009/0302722 | A1 * | 12/2009 | Mihara | G06F 1/1671 |
| | | | | 312/223.2 |
| 2009/0303680 | A1 * | 12/2009 | Mihara | G06F 1/20 |
| | | | | 361/679.55 |
| 2013/0286561 | A1 * | 10/2013 | Hokugou | G06F 1/1616 |
| | | | | 361/679.01 |
| 2014/0217875 | A1 * | 8/2014 | Park | G06F 1/1681 |
| | | | | 312/326 |
| 2016/0187935 | A1 * | 6/2016 | Tazbaz | H04M 1/0216 |
| | | | | 361/679.03 |
| 2016/0208530 | A1 * | 7/2016 | Tatsukami | G06F 1/1681 |
| 2017/0370136 | A1 * | 12/2017 | Huang | E05D 5/02 |
| 2019/0171253 | A1 * | 6/2019 | Hara | G06F 1/1656 |
| 2019/0171255 | A1 * | 6/2019 | Cheng | E05D 11/0054 |
| 2019/0196551 | A1 * | 6/2019 | Wang | F21V 33/0052 |

* cited by examiner

NOTEBOOK COMPUTER AND KEYBOARD DECORATIVE PANEL THEREOF

CROSS-REFERENCE TO RELATED APPLICATIONS

The present application claims the benefit of U.S. provisional Patent Application No. 62/889,266, filed on Aug. 20, 2019, the disclosure of which is hereby incorporated by reference herein in its entirety.

BACKGROUND OF THE INVENTION

Field of the Invention

The present disclosure relates to decorative panels and, more particularly, to a notebook computer and a keyboard decorative panel thereof.

Description of the Prior Art

The conventional process of changing a keyboard of a notebook computer entails removing a keyboard decorative panel (which otherwise covers the keyboard) completely and thus exposing fastening holes of the keyboard.

Since the prior art requires the complete removal of the keyboard decorative panel, the prior art has a drawback: poor keyboard decorative panel changing skills lead to errors in mounting the keyboard decorative panel or damage done to a wire concealed by the keyboard decorative panel, thereby putting the notebook computer at risk of damage or failure.

Therefore, it is imperative to simplify the process of changing a keyboard through an improvement in structural design with a view to overcoming the aforesaid drawback of the prior art.

SUMMARY OF THE INVENTION

In view of the aforesaid drawback of the prior art, it is an objective of the present disclosure to provide a notebook computer and a keyboard decorative panel thereof.

In order to achieve the above and other objectives, the present disclosure provides a keyboard decorative panel, adapted to conceal a hinge and a fastening hole of a keyboard module. The keyboard decorative panel comprises a first cover and a second cover. The first cover conceals the fastening hole of the keyboard module. The second cover conceals the hinge. The first cover and the second cover are capable of repeatedly bending toward each other and away from each other.

In order to achieve the above and other objectives, the present disclosure further provides a notebook computer comprising a casing, a keyboard module, a keyboard decorative panel and a flexible member. The keyboard module is disposed on the casing. The keyboard decorative panel is disposed on the casing to conceal a hinge on the casing and a fastening hole of the keyboard module. The keyboard decorative panel comprises a first cover and a second cover. The flexible member has flexibility. The first cover bends relative to the second cover because of the flexible member.

In order to achieve the above and other objectives, the present disclosure further provides a keyboard decorative panel, adapted to conceal a hinge. The keyboard decorative panel comprises a first cover, a second cover and a flexible member. The flexible member is connected between the first cover and the second cover. The flexible member has flexibility. The first cover bends relative to the second cover because of the flexible member.

An advantageous effect of the present disclosure is described below. The notebook computer and the keyboard decorative panel thereof, as provided by the present disclosure, have two advantages, namely "the first cover bends relative to the second cover because of the flexible member" and "the first cover and the second cover are capable of repeatedly bending toward each other and away from each other," thereby enhancing the ease of changing the keyboard module.

Technical features of the present disclosure are depicted by drawings and described below. However, the drawings are illustrative rather than restrictive of the present disclosure.

DETAILED DESCRIPTION OF THE EMBODIMENTS

Implementation of a notebook computer and a keyboard decorative panel thereof, as disclosed in the present disclosure, is hereunder illustrated by specific embodiments, and thus persons skilled in the art can gain insight into the advantages and effects of the present disclosure. The present disclosure can be implemented or applied by any other different specific embodiments. Various modifications or changes may be made to details described hereunder according to different points of views and applications without departing from concepts embodied in the present disclosure. The accompanying drawings of the present disclosure serve schematic purposes but are not drawn to scale. Technical features of the present invention are hereunder further described. However, the disclosure presented hereunder is not restrictive of the claimed scope of the present disclosure.

Although various components are hereunder described with ordinal numbers, such as "first", "second", and "third", the ordinal numbers are not restrictive of the components. The ordinal numbers are intended to distinguish the components from each other. The conjunction "or" used before the last in a list of possibilities must be interpreted, as appropriate, to mean an "exclusive or" or an "inclusive or".

First Embodiment

Referring to FIG. 1 through FIG. 4, there are shown in FIG. 1 through FIG. 4 schematic views of a notebook computer. The present disclosure provides a notebook computer P and a keyboard decorative panel 3 thereof. Described hereunder is the notebook computer P first and then the keyboard decorative panel 3.

Figure 1:
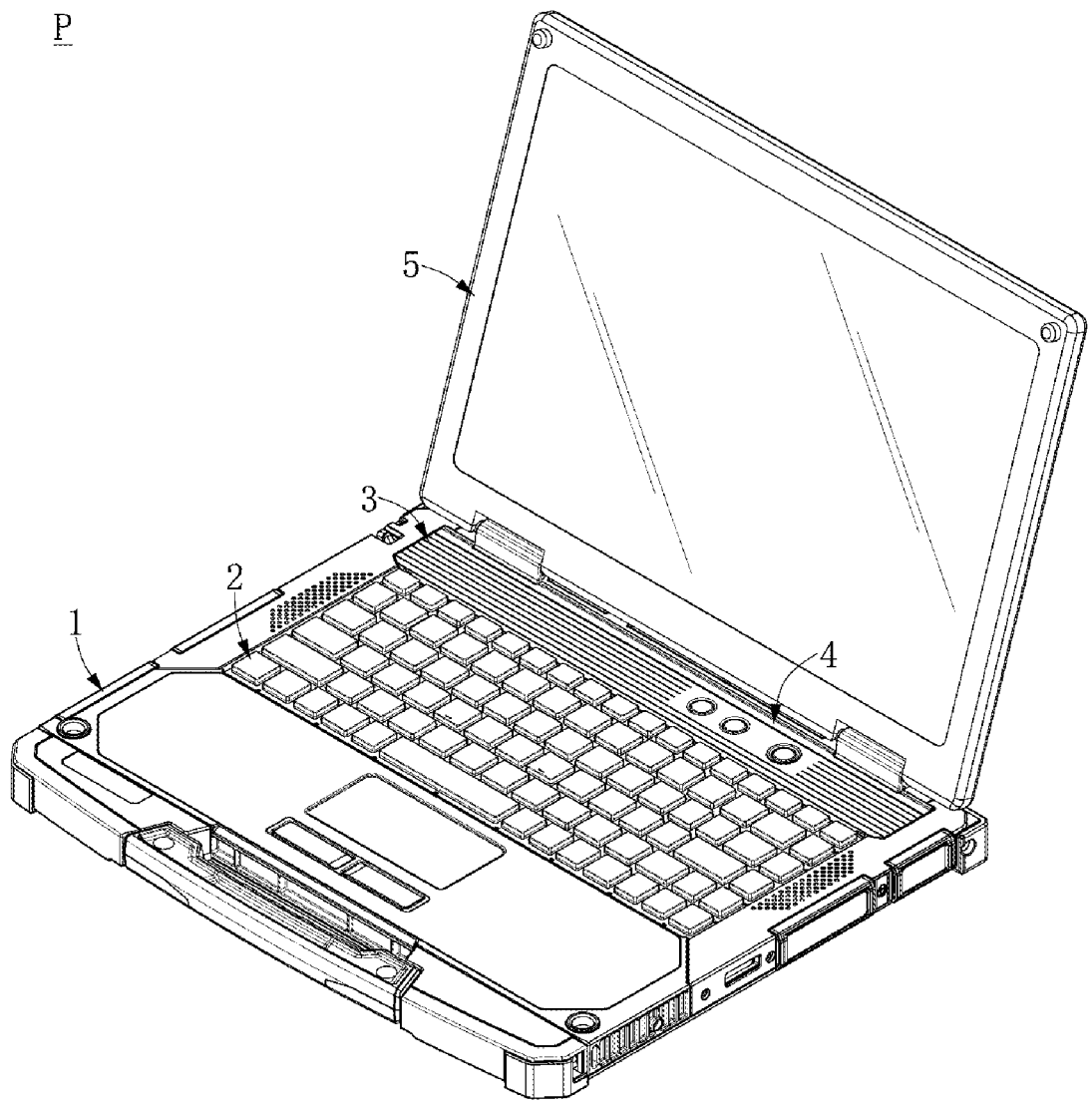
FIG. 1 is a perspective view of a notebook computer according to the first embodiment of the present disclosure.
Figure 2:
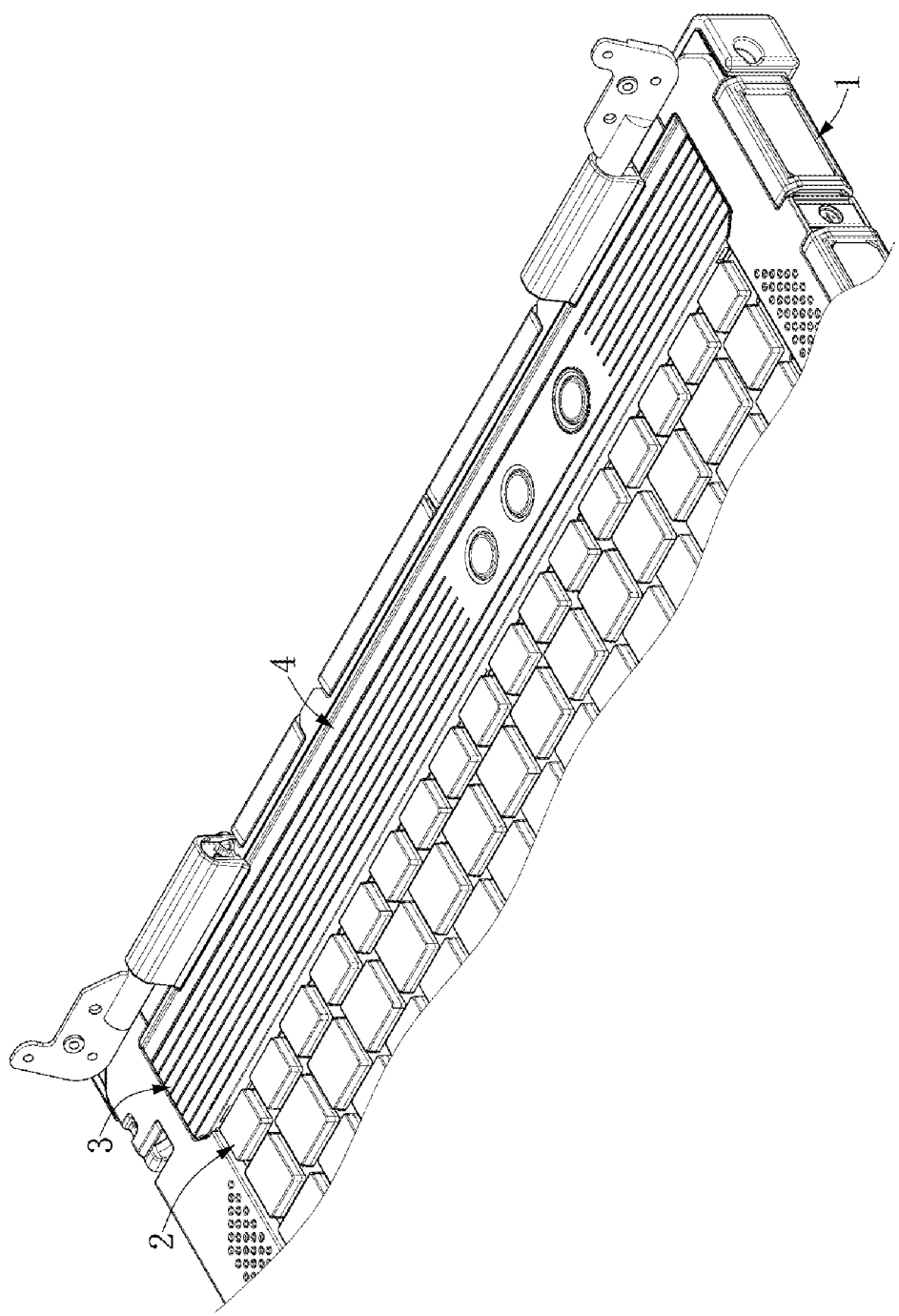
FIG. 2 is another perspective view of the notebook computer according to the first embodiment of the present disclosure.
Figure 3:
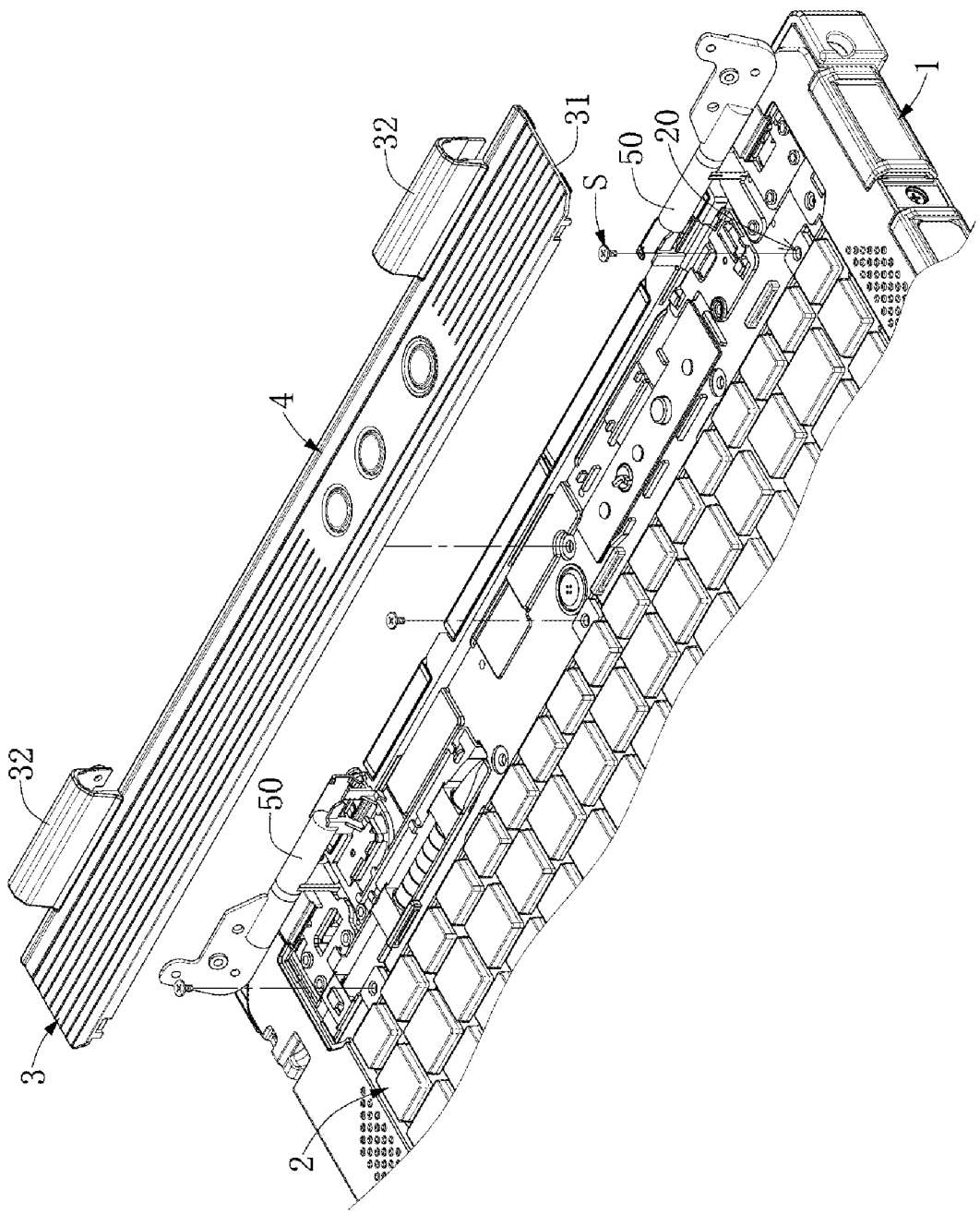
FIG. 3 is an exploded view of the notebook computer according to the first embodiment of the present disclosure.
Figure 4:
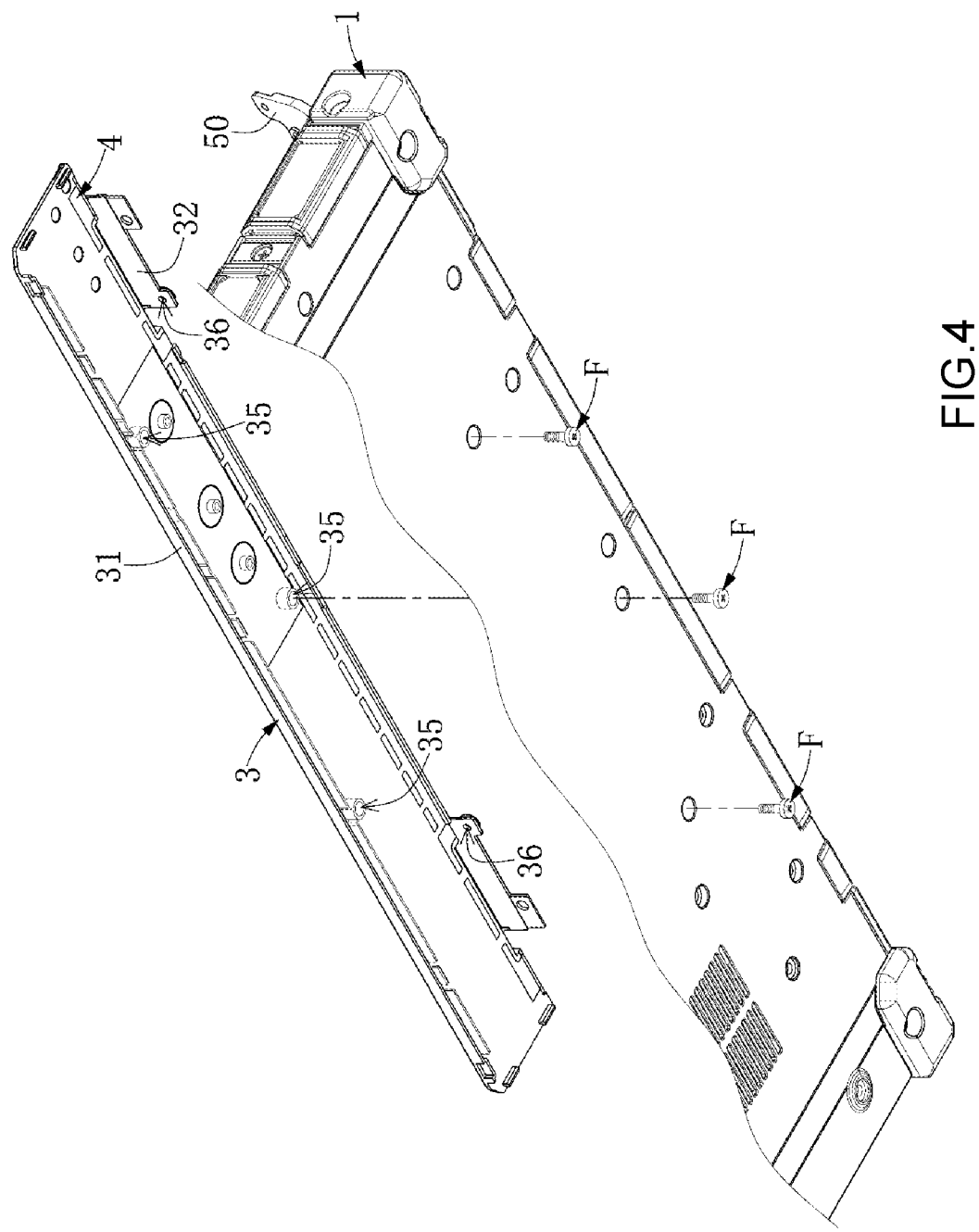
FIG. 4 is another exploded view of the notebook computer according to the first embodiment of the present disclosure.

The notebook computer P comprises a casing 1, a keyboard module 2 and a keyboard decorative panel 3. The keyboard module 2 is disposed on the casing 1. The keyboard decorative panel 3 is disposed on the casing 1 to conceal a hinge 50 disposed on the casing 1 and a fastening hole 20 of the keyboard module 2. The keyboard decorative panel 3 of the present disclosure is preferably applied to the notebook computer P and adapted to conceal the hinge 50 and the fastening hole 20 of the keyboard module. Therefore, the keyboard decorative panel 3 enhances the beauty of the notebook computer P. The hinge 50 is a rotating shaft of a screen 5 of the notebook computer P. For the sake of conciseness, FIG. 2 through FIG. 4 show the hinge 50 which the screen 5 attaches to rather than the screen 5.

The keyboard module 2 comprises a keyboard frame (not denoted by any reference numeral) and the fastening hole 20 disposed on the keyboard frame. The keyboard module 2 is fixed to the casing 1 by the fastening hole 20 and a fastening element S.

Figure 5:
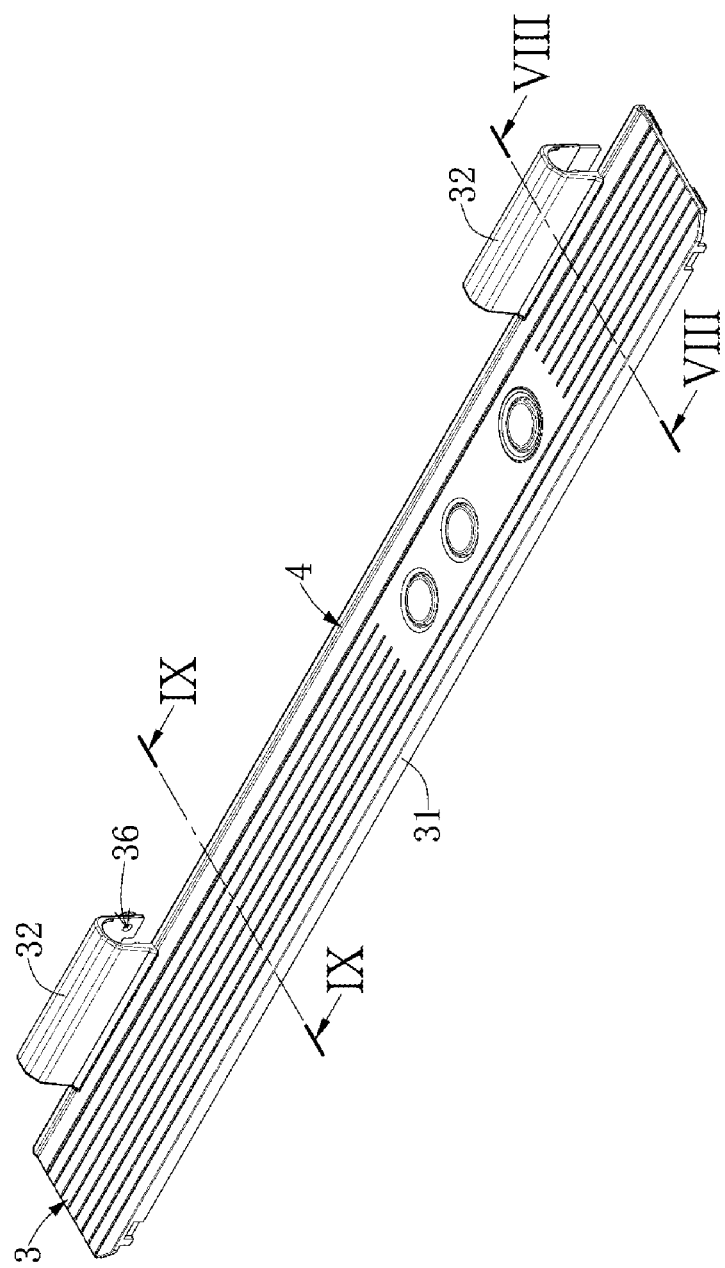
FIG. 5 is a perspective view of a keyboard decorative panel according to the first embodiment of the present disclosure.
Figure 6:
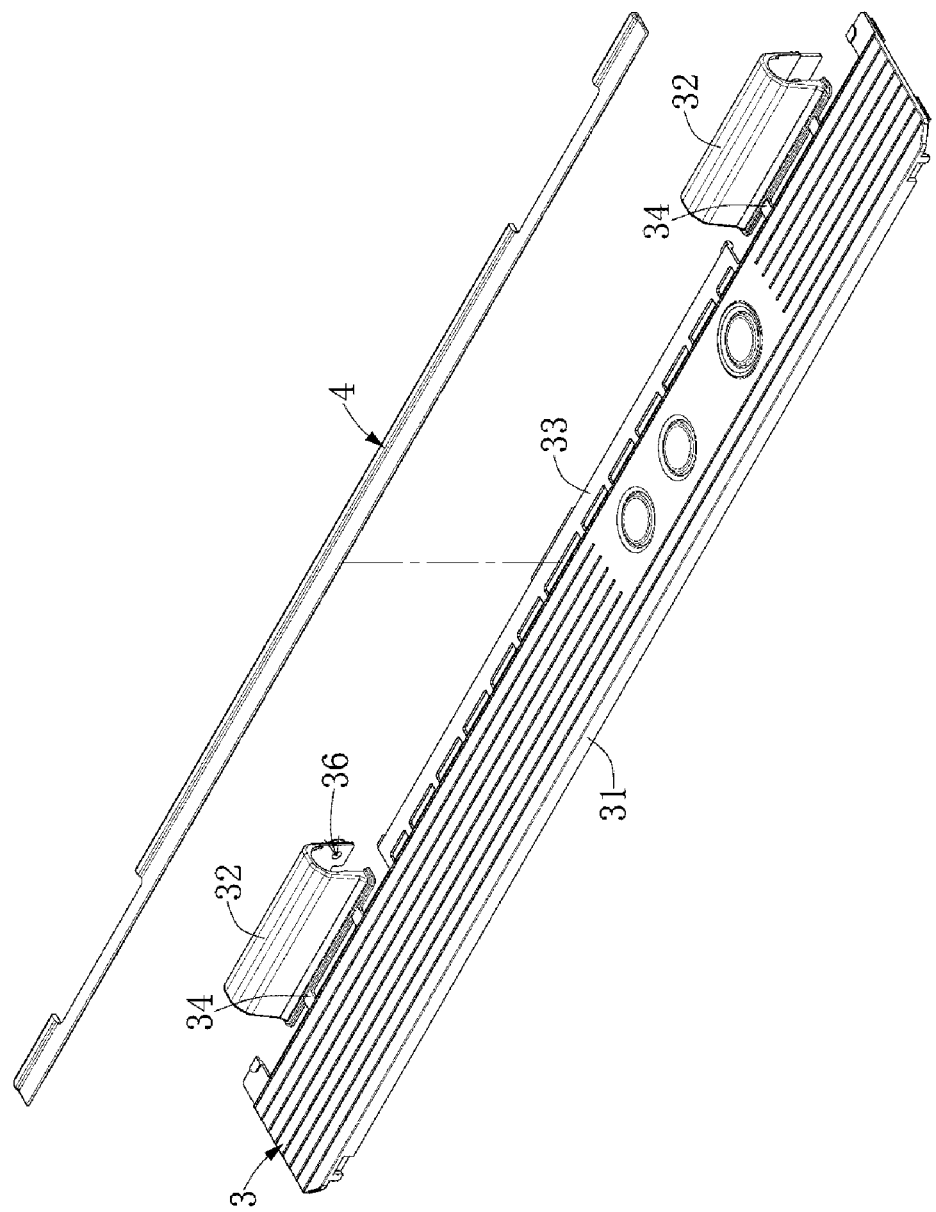
FIG. 6 is an exploded view of the keyboard decorative panel according to the first embodiment of the present disclosure.
Figure 7:
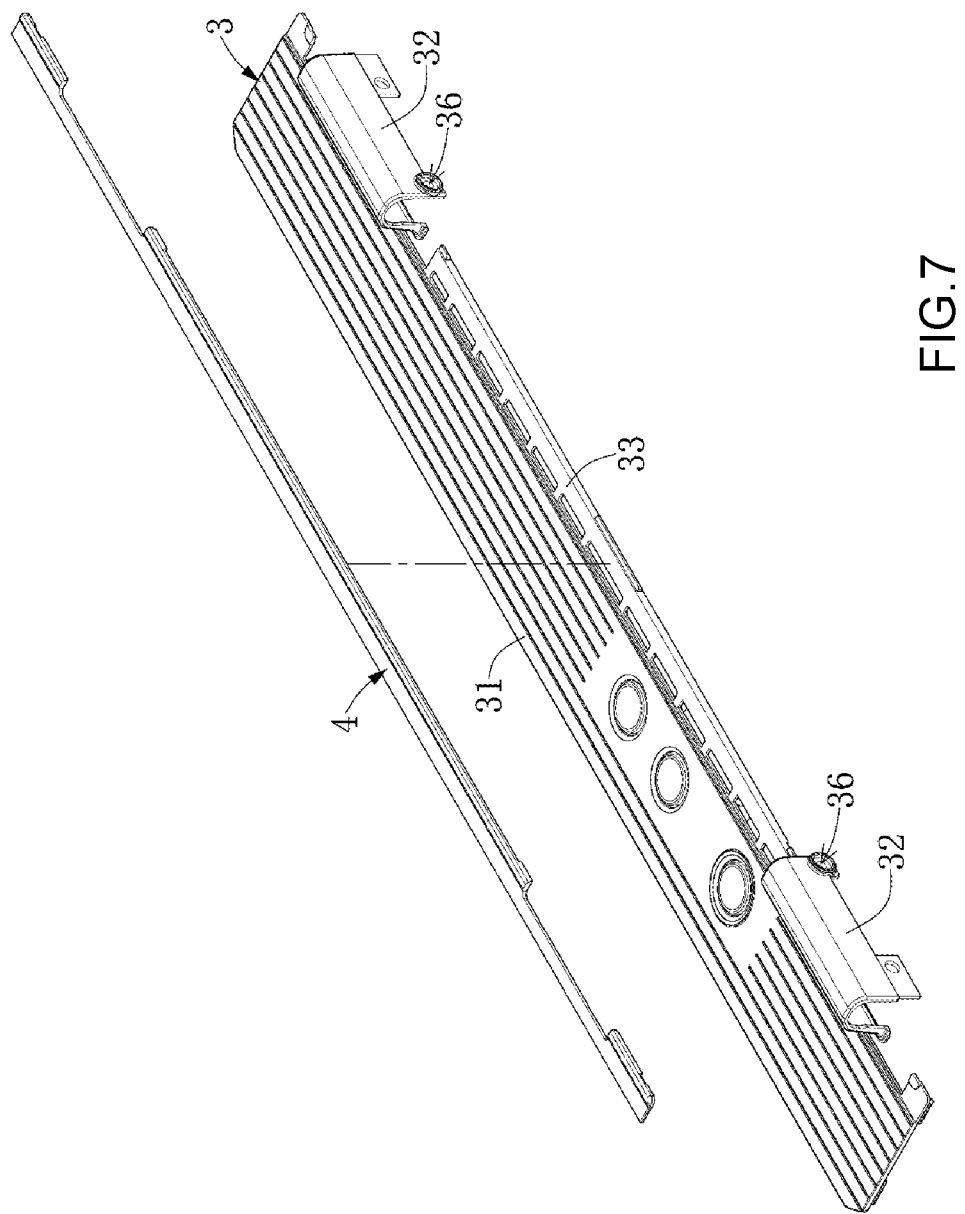
FIG. 7 is another exploded view of the keyboard decorative panel according to the first embodiment of the present disclosure.

Referring to FIG. 1 through FIG. 4 together with FIG. 5 through FIG. 7, the keyboard decorative panel of the present disclosure is further described in detail below. FIG. 5 is a perspective view of a keyboard decorative panel according to the first embodiment of the present disclosure. FIG. 6 and FIG. 7 are exploded views of the keyboard decorative panel according to the first embodiment of the present disclosure. The keyboard decorative panel 3 comprises a first cover 31, a second cover 32, and a flexible member 4 connected between the first cover 31 and the second cover 32. The flexible member 4 has flexibility. The first cover 31 bends relative to the second cover 32 because of the flexible member 4. The first cover 31 conceals the fastening hole 20 of the keyboard module 2. The second cover 32 conceals the hinge 50. The first cover 31 and the second cover 32 are capable of repeatedly bending toward each other and away from each other.

In the first embodiment, the vertical projection of the fastening hole 20 relative to the casing 1 has the same outline as the vertical projection of the first cover 31 relative to the casing 1. Therefore, the keyboard decorative panel 3 conceals the fastening hole 20 of the keyboard module 2 and the fastening element S.

For instance, the first cover 31 and the second cover 32 are made of the same material, but the flexible member 4 is made of a material different from those of the first cover 31 and the second cover 32. According to the present disclosure, the flexibility of the flexible member 4 is greater than the flexibility of the first cover 31, and the flexibility of the flexible member 4 is greater than the flexibility of the second cover 32. For instance, in a molding mode, the first cover 31, the second cover 32 and the flexible member 4 are made by double injection molding, and thus the flexible member 4 is formed between the first cover 31 and the second cover 32 by double injection molding, but the present disclosure is not limited thereto.

Referring to FIG. 6, in an embodiment, the keyboard decorative panel 3 further comprises a connection portion 34 connected between the first cover 31 and the second cover 32 and covered by the flexible member 4. For instance, the first cover 31, the second cover 32 and the connection portion 34 are made of the same material, but the flexible member 4 is made of a material different from that of the connection portion 34. In a variant embodiment, the connection portion 34 is dispensed with, and in consequence the first cover 31 and the second cover 32 are directly connected by the flexible member 4. For instance, the first cover 31, the second cover 32 and the connection portion 34 are made of plastic, and the flexible member 4 is made of rubber, but the present disclosure is not limited thereto.

Figure 8:
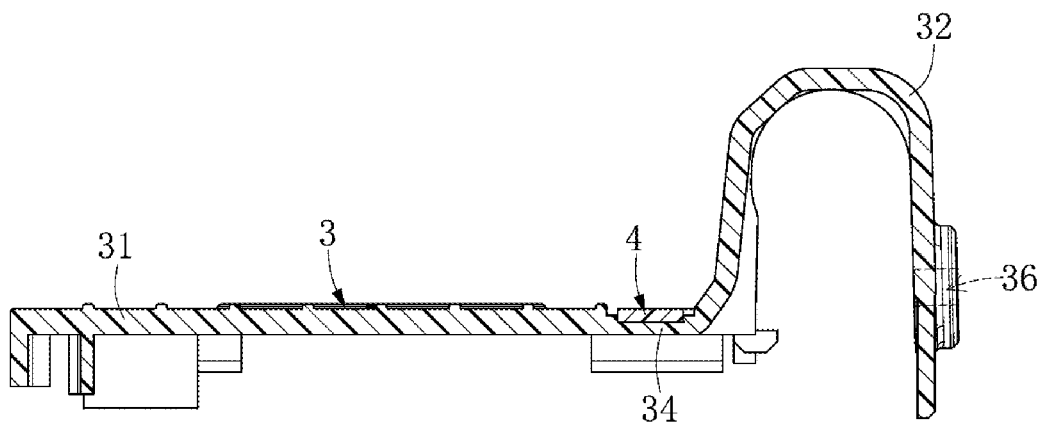
FIG. 8 is a cross-sectional view taken along line VIII-VIII of FIG. 5.
Figure 9:
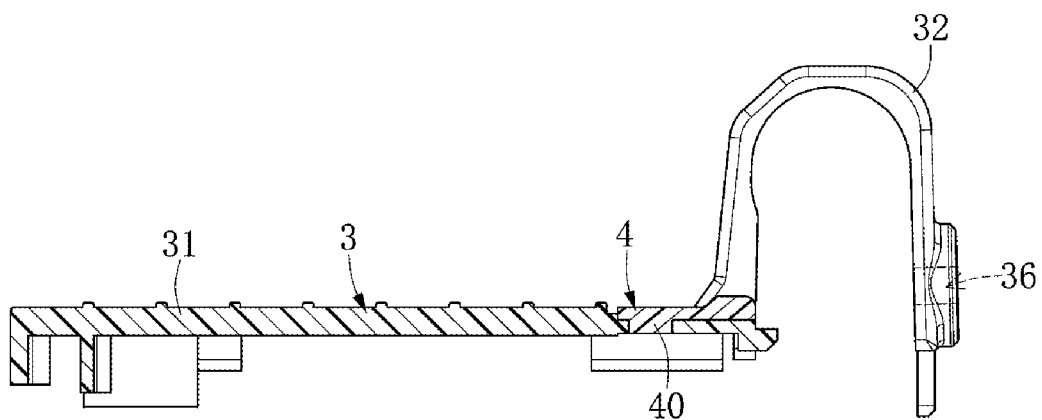
FIG. 9 is a cross-sectional view taken along line IX-IX of FIG. 5.

Referring to FIG. 1 through FIG. 7 together with FIG. 8 and FIG. 9, there is shown in FIG. 8 a cross-sectional view taken along line VIII-VIII of FIG. 5, and there is shown in FIG. 9 a cross-sectional view taken along line IX-IX of FIG. 5. In an embodiment where the first cover 31, the second cover 32 and the flexible member 4 are made by double injection molding, the connection portions 34 are spaced apart from each other and connected between the first cover 31 and the second cover 32, whereas the flexible member 4 covers the connection portions 34. As shown in FIG. 8, in this specific embodiment, although the first cover 31, the second cover 32 and the connection portions 34 are formed by integral injection molding and made of the same material, the connection portions 34 are thinner than the first cover 31 and the second cover 32. As shown in FIG. 4, FIG. 8 and FIG. 9, the flexible member 4 is formed at the connection portions 34 or at the junction of the first cover 31 and the second cover 32 by double injection and made of a material more flexible than those of the first cover 31 and the second cover 32. The keyboard decorative panel 3 further has an inlay portion 33 extending from the first cover 31 and positioned between two said second covers 32. Similarly, the inlay portion 33 and the first cover 31 are formed by integral injection molding and made of the same material. The inlay portion 33 has through holes whereby the inlay portion 33 is inlaid with embedded portions 41 of the flexible member 4. Furthermore, the other embedded portions 41 of the flexible member 4 are embedded between two said connection portions 34. Consequently, not only are the keyboard decorative panel 3 and the flexible member 4 engaged with each other, but their contact areas also increase greatly. The keyboard decorative panel 3 further comprises a position-limiting hole 36 disposed on the second cover 32. The second cover 32 is fixed to the casing 1 by passing a screw (not shown) through the position-limiting hole 36.

Figure 10:
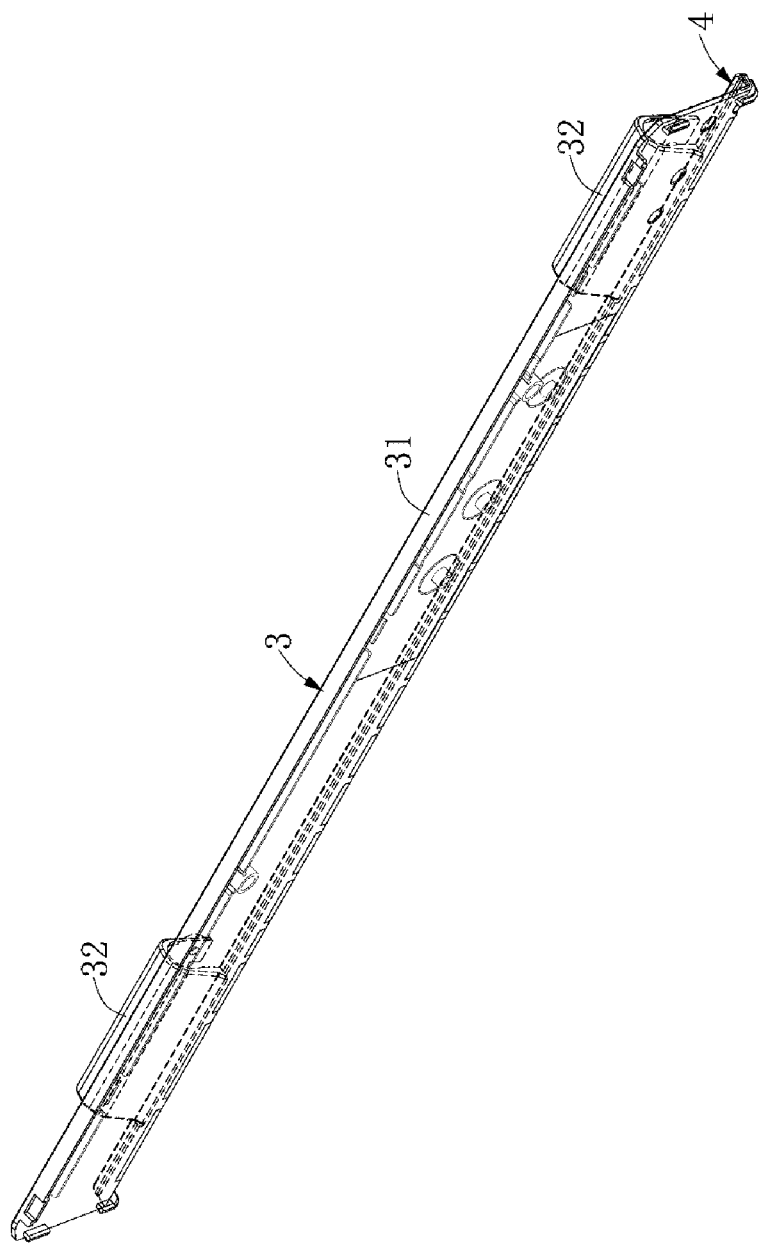
FIG. 10 is a schematic view of the usage state of the keyboard decorative panel according to the first embodiment of the present disclosure.
Figure 11:
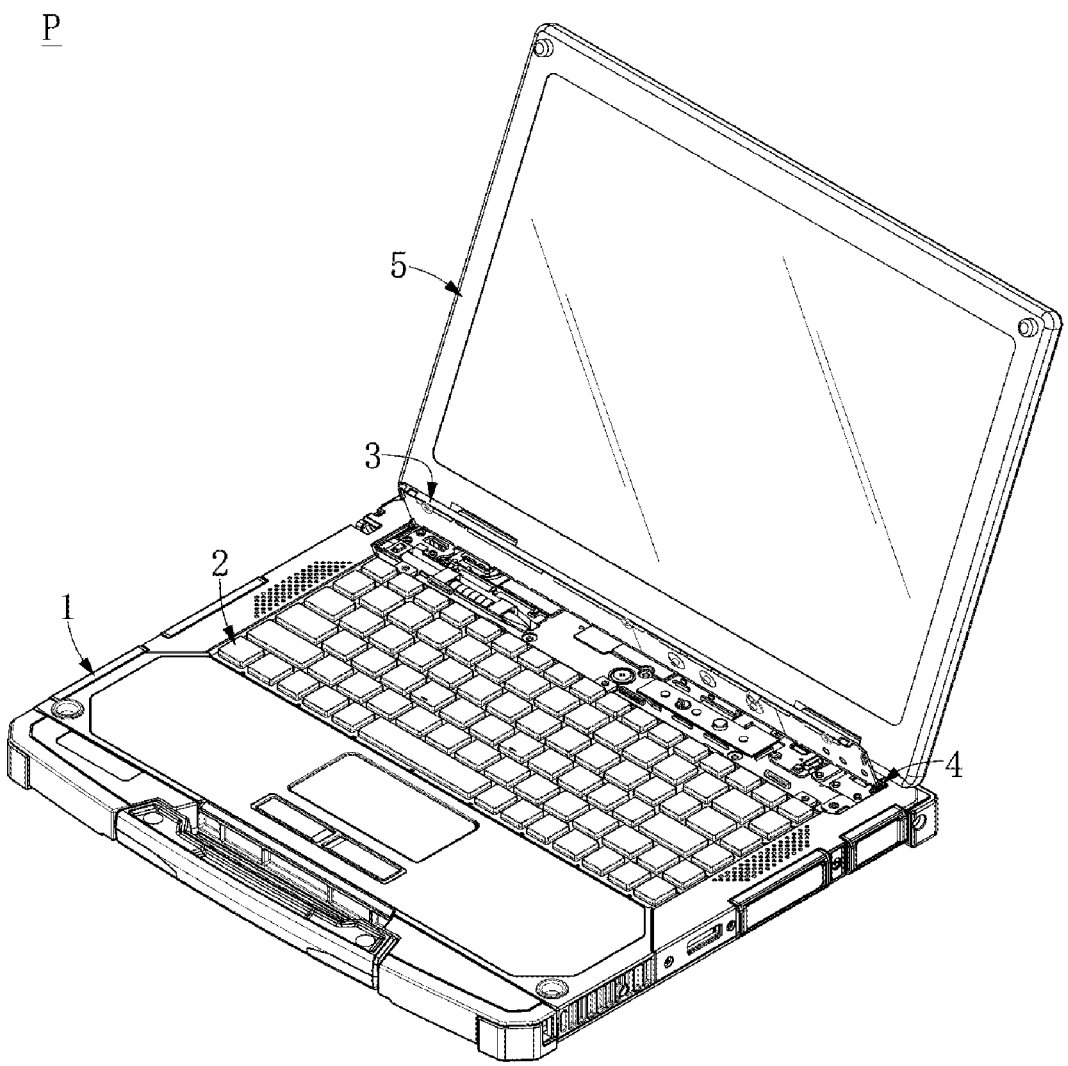
FIG. 11 is another schematic view of the usage state of the keyboard decorative panel according to the first embodiment of the present disclosure.

Referring to FIG. 1 through FIG. 7 together with FIG. 10 and FIG. 11, there are shown in FIG. 10 and FIG. 11 schematic views of the usage state of the keyboard decorative panel according to the first embodiment of the present disclosure. The notebook computer P further comprises positioning elements F. The keyboard decorative panel 3 further comprises positioning holes 35. The positioning holes 35 are disposed on the bottom side of the keyboard decorative panel 3. The positioning elements F correspond in position to the positioning holes 35, respectively. The keyboard decorative panel 3 is fixed to the casing 1 by the positioning elements F. For instance, the positioning elements F are screws but are not limited thereto. In the first embodiment, the positioning elements F advance in the direction from the bottom of the casing 1 to the keyboard decorative panel 3 in order to fix the keyboard decorative panel 3 in place, but the present disclosure is not limited thereto. In this specific embodiment, the keyboard decorative panel 3 comprises plastic cylinders which are formed by integral molding and inlaid with copper screw nuts by ultrasonic welding. The internal threads of the copper screw nuts mesh with the external threads of the positioning elements F, such that the positioning elements F can be inserted from outside the casing 1 and then fastened to the positioning holes 35 so as to fix the keyboard decorative panel 3 in place. In this specific embodiment, the positioning holes 35 are blind holes, and thus the keyboard decorative panel 3 dispenses with through holes which screws are otherwise fastened to. Therefore, this specific embodiment dispenses with the hassles of concealing the aforesaid through holes. In this specific embodiment, the keyboard decorative panel 3 which dispenses with the through holes conceals the fastening hole 20 of the keyboard module 2 to not only allow the operating appearance of the notebook computer P to have no or a greatly reduced number of exposed holes but also spare users the need to remove the hinge-concealing second cover 32 during the process of changing the keyboard module 2. Therefore, in this specific embodiment, it is impossible for the users changing the keyboard module 2 to touch or even move various wires concealed by the second cover 32 and thus fail to restore the wires to their original positions due to poor assembly skills, thereby causing damage to the notebook computer P. In addition, the flexible member 4, which has high mechanical strength and is formed between the first cover 31 and the second cover 32 by integral molding, ensures that the point of bend can withstand repeated operation without undergoing fatigue failure.

The first cover 31 is disposed between the flexible member 4 and the keyboard module 2. To change the keyboard module 2, the first thing the users have to do is remove the positioning elements F adapted to fix the first cover 31 to the casing 1. Then, the users bend the first cover 31 while the second cover 32 is still fixed to the casing 1 and thereby bend the first cover 31 upward relative to the second cover 32 so as to expose the fastening hole 20 of the keyboard module 2 (not only because the flexible member 4 has flexibility, but also because the first cover 31 can bend relative to the second cover 32 by means of the flexible member 4), as shown in FIG. 10.

Second Embodiment

Figure 12:
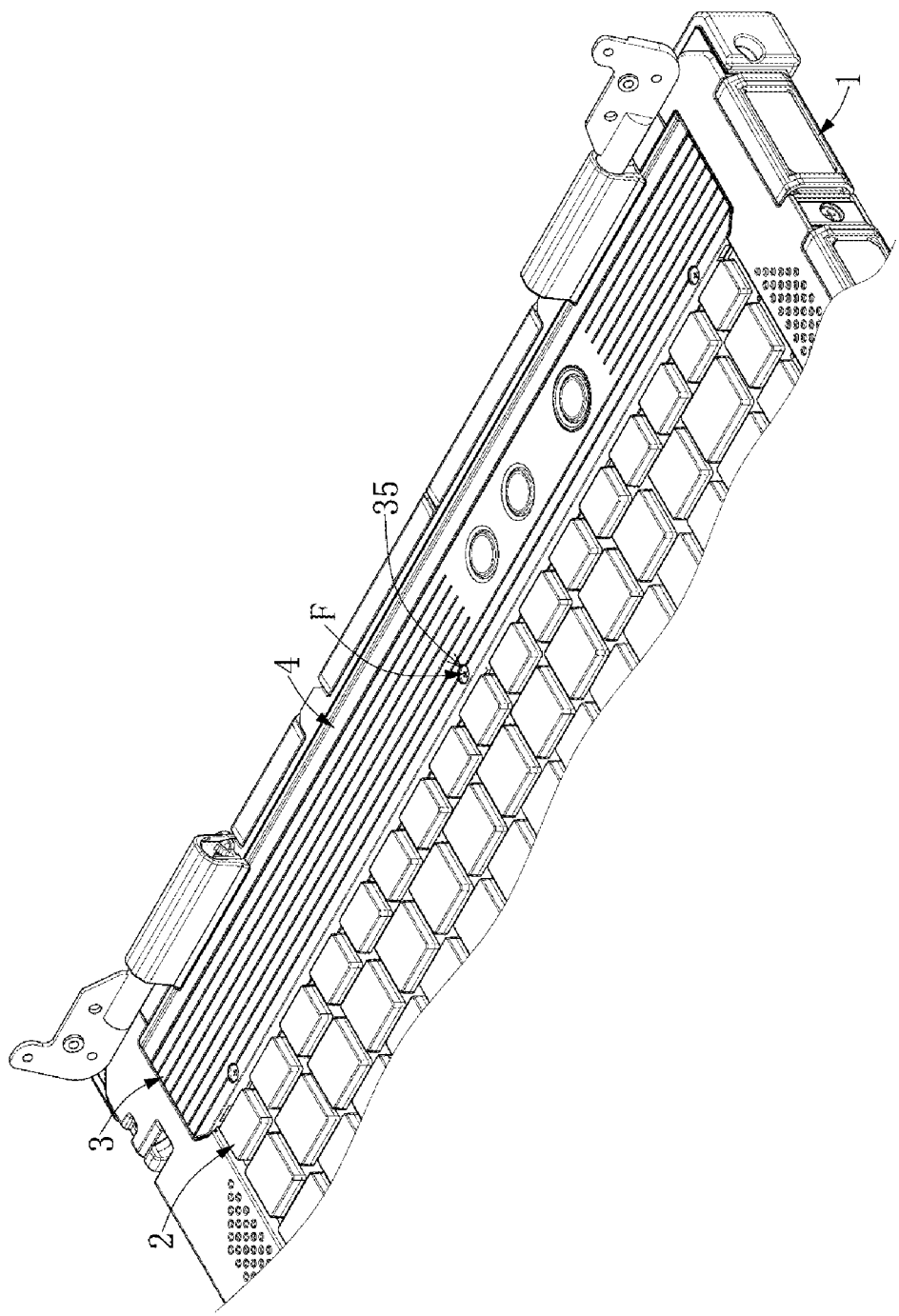
FIG. 12 is a perspective view of the notebook computer according to the second embodiment of the present disclosure.
Figure 13:
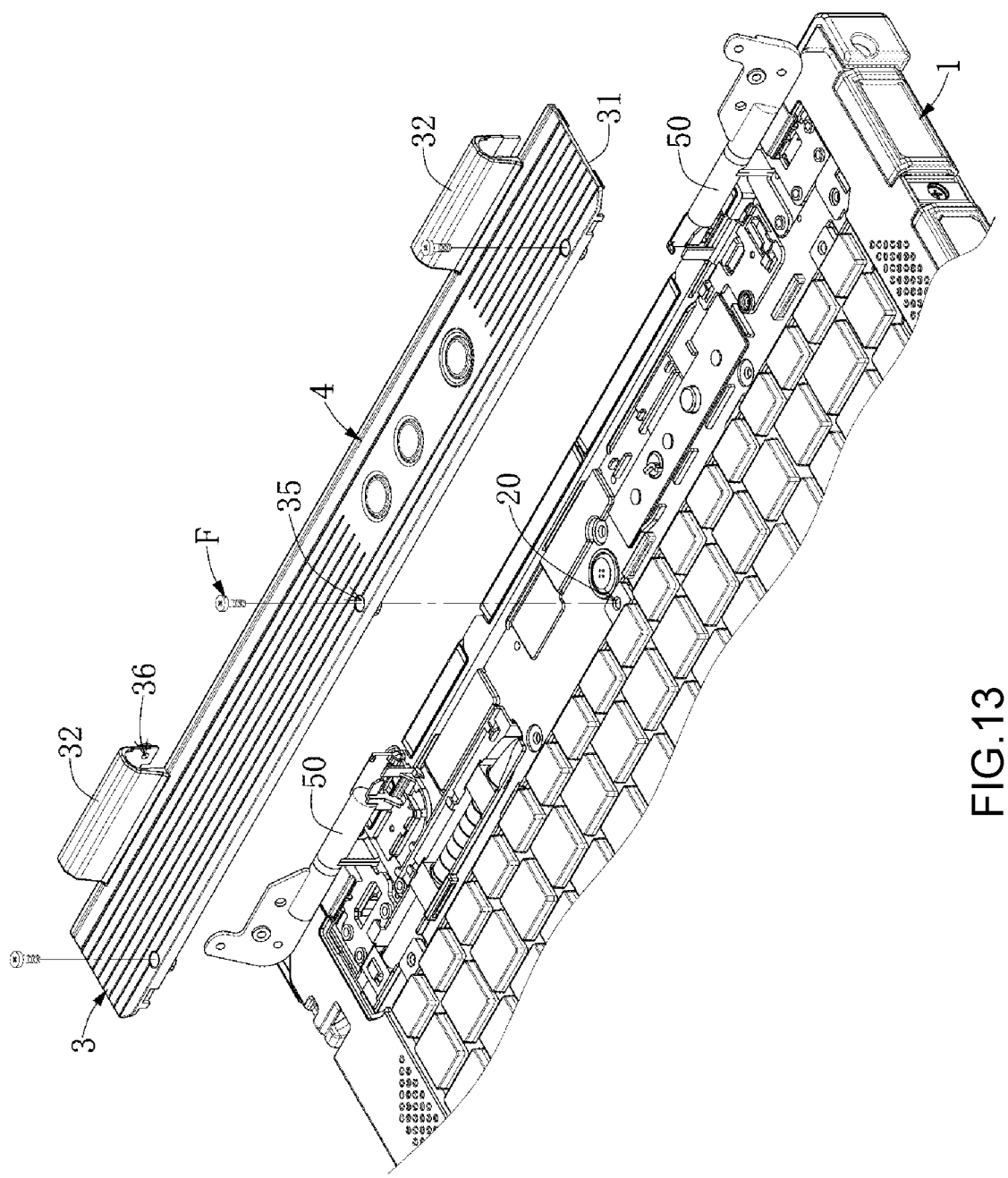
FIG. 13 is an exploded view of the notebook computer according to the second embodiment of the present disclosure.

Referring to FIG. 12 and FIG. 13, there are shown in FIG. 12 and FIG. 13 a perspective view and an exploded view of the notebook computer according to the second embodiment of the present disclosure, respectively. By comparing FIG. 12 and FIG. 13 with FIG. 2 and FIG. 3, it is realized that the keyboard decorative panel 3 in the second embodiment is distinguished most markedly from the keyboard decorative panel 3 in the first embodiment by the technical feature: the keyboard decorative panel 3 in the second embodiment differs from the keyboard decorative panel 3 in the first embodiment in terms of how it is positioned in place. The positioning holes 35 of the keyboard decorative panel 3 in the first embodiment are disposed on the bottom side of the keyboard decorative panel 3. By contrast, the positioning holes 35 of the keyboard decorative panel 3 in the second embodiment are disposed on the first cover 31 and penetrate the first cover 31. The other technical features of the notebook computer P and the keyboard decorative panel 3 in the second embodiment are similar to those in the first embodiment and thus are, for the sake of brevity, not described again.

The positioning holes 35 correspond in position to the fastening holes 20, respectively. The positioning elements F penetrate the positioning holes 35 and the fastening holes 20, respectively. Therefore, in the second embodiment, the positioning elements F advance in the direction from the top of the keyboard decorative panel 3 to the bottom of the casing 1 in order to fix the keyboard decorative panel 3 in place, but the present disclosure is not limited thereto. Therefore, the positioning elements F are concurrently fastened to the positioning holes 35 of the keyboard decorative panel 3 and the fastening holes 20 of the keyboard module 2. In this specific embodiment, the positioning holes 35 are through holes.

Figure 14:
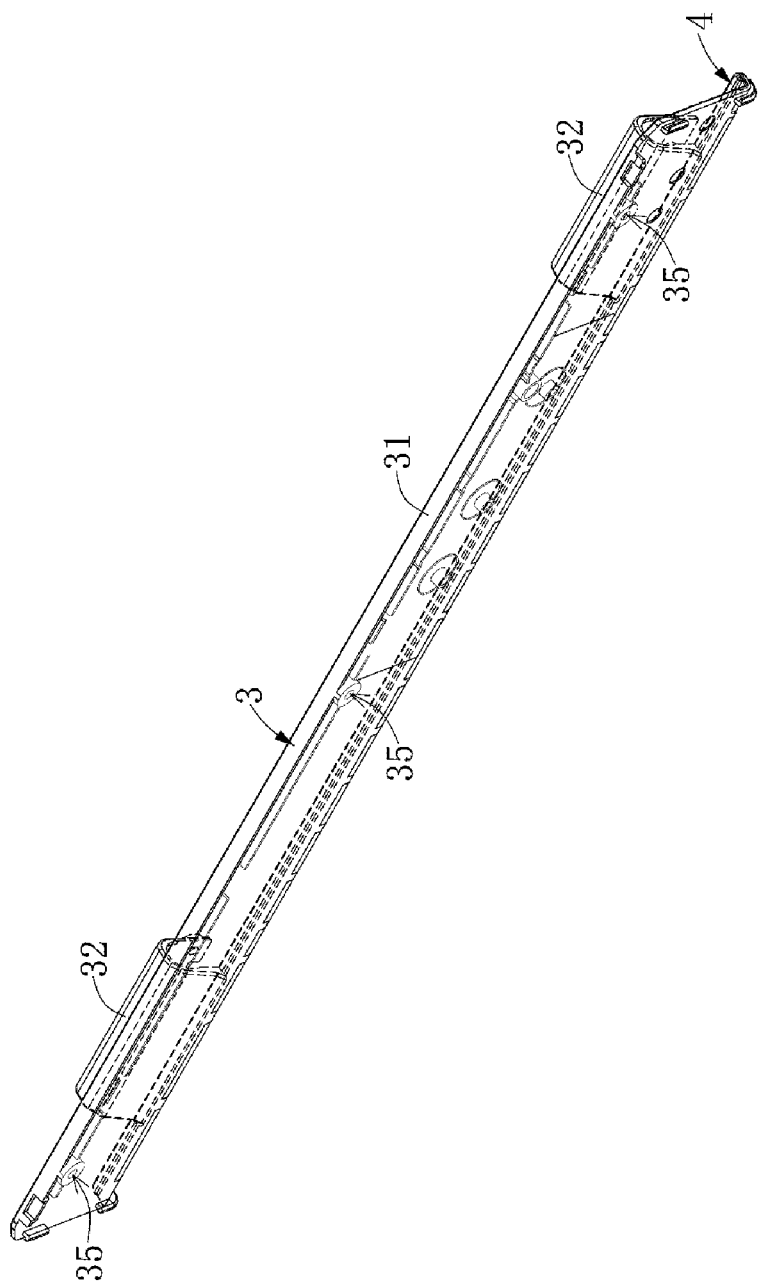
FIG. 14 is a schematic view of the usage state of the keyboard decorative panel according to the second embodiment of the present disclosure.

Referring to FIG. 14, there is shown in FIG. 14 a schematic view of the usage state of the keyboard decorative panel according to the second embodiment of the present disclosure. To change the keyboard module 2, the first thing the users have to do is remove the positioning elements F adapted to fix the first cover 31 to the casing 1. Then, the users bend the first cover 31 while the second cover 32 is still fixed to the casing 1 and thereby bend the first cover 31 upward relative to the second cover 32 so as to expose the fastening hole 20 of the keyboard module 2 (not only because the flexible member 4 has flexibility, but also because the first cover 31 can bend relative to the second cover 32 by means of the flexible member 4), as shown in FIG. 14.

Advantageous Effect of Embodiment

An advantageous effect of the present disclosure is described below. The notebook computer P and the keyboard decorative panel 3 thereof, as provided by the present disclosure, have two advantages, namely "the first cover 31 bends relative to the second cover 32 because of the flexible member 4" and "the first cover 31 and the second cover 32 are capable of repeatedly bending toward each other and away from each other," thereby enhancing the ease of changing the keyboard module 2.

Furthermore, the aforesaid advantages preclude errors in mounting the keyboard decorative panel 3 or damage done to a wire concealed by the keyboard decorative panel 3 and thereby avoid putting the notebook computer P at risk of damage or failure.

Preferred, feasible embodiments of the present disclosure are disclosed above but are not intended to limit the claims of the present disclosure. Therefore, all equivalent technical variations attained in accordance with the specification and drawings of the present disclosure must be deemed falling within the scope of the claims of the present disclosure.

What is claimed is:
1. A keyboard decorative panel, adapted to conceal a hinge and a fastening hole of a keyboard module, the keyboard decorative panel comprising:
    a first cover for concealing the fastening hole of the keyboard module; and a second cover for concealing the hinge, wherein the first cover and the second cover are capable of repeatedly bending toward each other and away from each other, wherein a flexible member with flexibility is disposed between the first cover and the second cover, the first cover is bendable upward relative to the second cover because of the flexible member, so as to expose the fastening hole of the keyboard module.

2. The keyboard decorative panel of claim 1, wherein the flexible member disposed between the first cover and the second cover is formed by double injection molding.

3. A notebook computer, comprising:
a casing;
a keyboard module disposed on the casing;
a keyboard decorative panel disposed on the casing to conceal a hinge on the casing and a fastening hole of the keyboard module and comprising a first cover and a second cover; and
a flexible member connected between the first cover and the second cover and having flexibility, wherein the first cover is bendable relative to the second cover because of the flexible member so as to expose the fastening hole of the keyboard module.

4. The notebook computer of claim 3, wherein the first cover conceals the fastening hole of the keyboard module, and the second cover conceals the hinge disposed on the casing.

5. The notebook computer of claim 3, wherein a vertical projection of the fastening hole relative to the casing has a same outline as a vertical projection of the first cover relative to the casing.

6. The notebook computer of claim 3, wherein flexibility of the flexible member is greater than flexibility of the first cover, and flexibility of the flexible member is greater than flexibility of the second cover.

7. The notebook computer of claim 3, wherein the first cover and the second cover are made of the same material, but the flexible member is made of a material different from those of the first cover and the second cover, wherein the first cover, the second cover and the flexible member are made by double injection molding.

8. The notebook computer of claim 3, wherein the first cover is disposed between the flexible member and the keyboard module.

9. The notebook computer of claim 3, further comprises positioning elements corresponding in position to positioning holes of the keyboard decorative panel, respectively, wherein the keyboard decorative panel is fixed to the casing by the positioning elements.

10. The notebook computer of claim 9, wherein the positioning holes correspond in position to the fastening holes, respectively, and the positioning elements penetrate the positioning holes and the fastening holes, respectively.

11. A keyboard decorative panel, adapted to conceal a hinge of an electronic device having a keyboard module, the keyboard module having a fastening hole, the keyboard decorative panel comprising:
a first cover adapted to conceal the fastening hole when the keyboard decorative panel is fixed to the electronic device;
a second cover adapted to conceal the hinge when the keyboard decorative panel is fixed to the electronic device; and
a flexible member connected between the first cover and the second cover and having flexibility, arranged such that while the second cover is fixed to the electronic device the first cover is bendable relative to the second cover because of the flexible member so as to expose the fastening hole of the keyboard module.

12. The keyboard decorative panel of claim 11, wherein flexibility of the flexible member is greater than flexibility of the first cover, and flexibility of the flexible member is greater than flexibility of the second cover.

13. The keyboard decorative panel of claim 11, wherein the first cover and the second cover are made of a same material, but the flexible member is made of a material different from those of the first cover and the second cover, wherein the first cover, the second cover and the flexible member are made by double injection molding.

* * * * *